(12) United States Patent
Sandoval et al.

(10) Patent No.: US 6,700,799 B2
(45) Date of Patent: Mar. 2, 2004

(54) ELECTROMAGNETIC INTERFERENCE CONTAINMENT APPARATUS

(75) Inventors: Alisa C. Sandoval, Grass Valley, CA (US); Andrew Michael Cherniski, Rescue, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/215,616

(22) Filed: Aug. 8, 2002

(65) Prior Publication Data

US 2003/0174488 A1 Sep. 18, 2003

(51) Int. Cl.[7] .............................. H05K 9/00; H05K 7/14; H05K 7/18; H01B 11/02; H01B 11/06
(52) U.S. Cl. ........................ 361/818; 361/816; 361/799; 361/753; 174/35 GC; 174/35 R; 439/927; 439/92
(58) Field of Search ................................. 361/816, 818, 361/800, 799, 753, 801, 802, 726, 728, 740, 741, 747, 756, 757, 759; 174/35 R, 35 GC, 35 MS, 51; 211/41.17, 26.2; 277/920, 653, 944; 439/86, 89, 92, 609, 927

(56) References Cited

U.S. PATENT DOCUMENTS

| | | | | |
|---|---|---|---|---|
| 5,656,795 A | * | 8/1997 | Miska et al. | 174/35 GC |
| 5,712,449 A | * | 1/1998 | Miska et al. | 174/35 GC |
| 6,252,160 B1 | * | 6/2001 | Chang et al. | 174/35 R |
| 6,359,214 B1 | * | 3/2002 | Worley et al. | 174/35 GC |

* cited by examiner

*Primary Examiner*—Phuong T. Vu

(57) ABSTRACT

The present invention is electromagnetic interference containment apparatus. In one embodiment, a layer of compressible material is disposed between an electromagnetic interference source and a bulkhead coupled to the electromagnetic interference source. The layer of compressible material has a first thickness and a second thickness. A first layer of conductive material is disposed on the back side of the layer of compressible material and is electrically coupled to the electromagnetic interference source. The first layer of conductive material is for absorbing electromagnetic emissions from the electromagnetic interference source. A second layer of conductive material is disposed on the front side of the layer of compressible material and is electrically coupled to the first layer of conductive material. The second layer of conductive material is for electrically contacting the bulkhead and for conducting the electromagnetic emissions to the bulkhead.

9 Claims, 6 Drawing Sheets to# ELECTROMAGNETIC INTERFERENCE CONTAINMENT APPARATUS

RELATED APPLICATIONS

The present application benefits from U.S. patent application Ser. No. 10/098,560 filed Mar. 14, 2002 entitled An Electromagnetic Interference Containment Apparatus by A. Sandoval, and M. Cherniski, assigned to the assignee of the present invention, and which is hereby incorporated by reference in its entirety herein.

TECHNICAL FIELD

Embodiments of the present invention are directed to electromagnetic interference shielding. More specifically, embodiments of the present invention are directed to an electromagnetic interference containment device.

BACKGROUND ART

Any device or system that generates an electromagnetic field has the potential to disrupt the operation of electronic components, devices, and systems in its vicinity. This phenomenon is known as electromagnetic interference or EMI. For example, the internal circuits of personal computers generate RF fields which can interfere with the effective performance of other electrical equipment nearby. Problems with EMI can be minimized by ensuring that electronic equipment is operated with a good electrical ground system and is properly shielded.

Most computer systems have connectors for a variety of peripheral devices such as printer ports, network interfaces, etc. In one type of computer system, a printed circuit assembly (PCA) is inserted into an expansion slot of a chassis. A bulkhead is coupled with the PCA and provides the means for rigidly coupling the PCA with the chassis. The connector is located on the edge of the PCA and extends through an opening in the bulkhead. Part of the design specification for such systems requires a specific separation tolerance between the connector and the bulkhead. This separation tolerance allows a range of motion between the two components. Usually, this separation tolerance allows an air gap between the connector and the bulkhead to exist through which EMI can leak and affect other electronic equipment.

One solution to prevent this EMI leakage has been to fit a thin sheet metal shield which closes the gap between the connector and the bulkhead. The main requirement of the shield is that it prevents EMI emissions from leaking and conducts them to the grounded chassis of the computer system via the bulkhead. Typically, an opening is created in the shield which is slightly smaller than the connector and the edges of the opening are cut to create a series of "fingers" around the periphery of the opening. When the shield is pressed onto the connector, the fingers bend around and contact the connector and, once the bulkhead is coupled with the PCA, conduct the EMI emissions to the chassis.

As technology trends are creating higher frequency computer components, higher frequency EMI emissions are generated. In order to effectively contain these higher frequency emissions, the fingers of the EMI shields must be moved closer together. However, fabricating EMI shields is becoming increasingly expensive. Specifically, the tooling costs associated with producing the smaller cut-outs is becoming too expensive relative to the actual value of the EMI shield itself. The high investment in tooling also makes it difficult to prototype different designs or make changes to the existing design. Furthermore, the fingers are now so small and delicate that handling and installation of the EMI shield is difficult. Specifically, the force needed to insert the shield onto the connector often bends or breaks the smaller fingers which renders the EMI shield useless. Additionally the smaller fingers are so thin that a user can easily be cut by the EMI shield when handling it.

Another problem associated with sheet metal EMI shields is that they can not easily accommodate different separation tolerances and minimum compression requirements throughout the EMI shield. For example, the separation tolerance between the bulkhead and the PCA may be 0.6 mm, while the separation tolerance between the bulkhead and the chassis may be 1.2 mm or larger. Generally, the tooling used to fabricate EMI shields can not accommodate these different tolerances. Therefore, the EMI shield is fabricated using an average value of the two tolerances. This can result in an excessively tight fit between the PCA and the bulkhead, while the fit between the bulkhead and the chassis is not tight enough to prevent EMI leakage.

DISCLOSURE OF THE INVENTION

In one embodiment, a layer of compressible material is disposed between an electromagnetic interference source and a bulkhead coupled to the electromagnetic interference source. The layer of compressible material has a first thickness and a second thickness. A first layer of conductive material is disposed on the back side of the layer of compressible material and is electrically coupled to the electromagnetic interference source. The first layer of conductive material is for absorbing electromagnetic emissions from the electromagnetic interference source. A second layer of conductive material is disposed on the front side of the layer of compressible material and is electrically coupled to the first layer of conductive material. The second layer of conductive material is for electrically contacting the bulkhead and for conducting the electromagnetic emissions to the bulkhead.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

MODES FOR CARRYING OUT THE INVENTION

Reference will now be made in detail to embodiments of the present invention, examples of which are illustrated in the accompanying drawings. While the present invention will be described in conjunction with these embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, the present invention may be practiced without these specific details. In other instances, some methods, procedures, and components have not been described in detail so as not to unnecessarily obscure aspects of the present invention.

Figure 1:
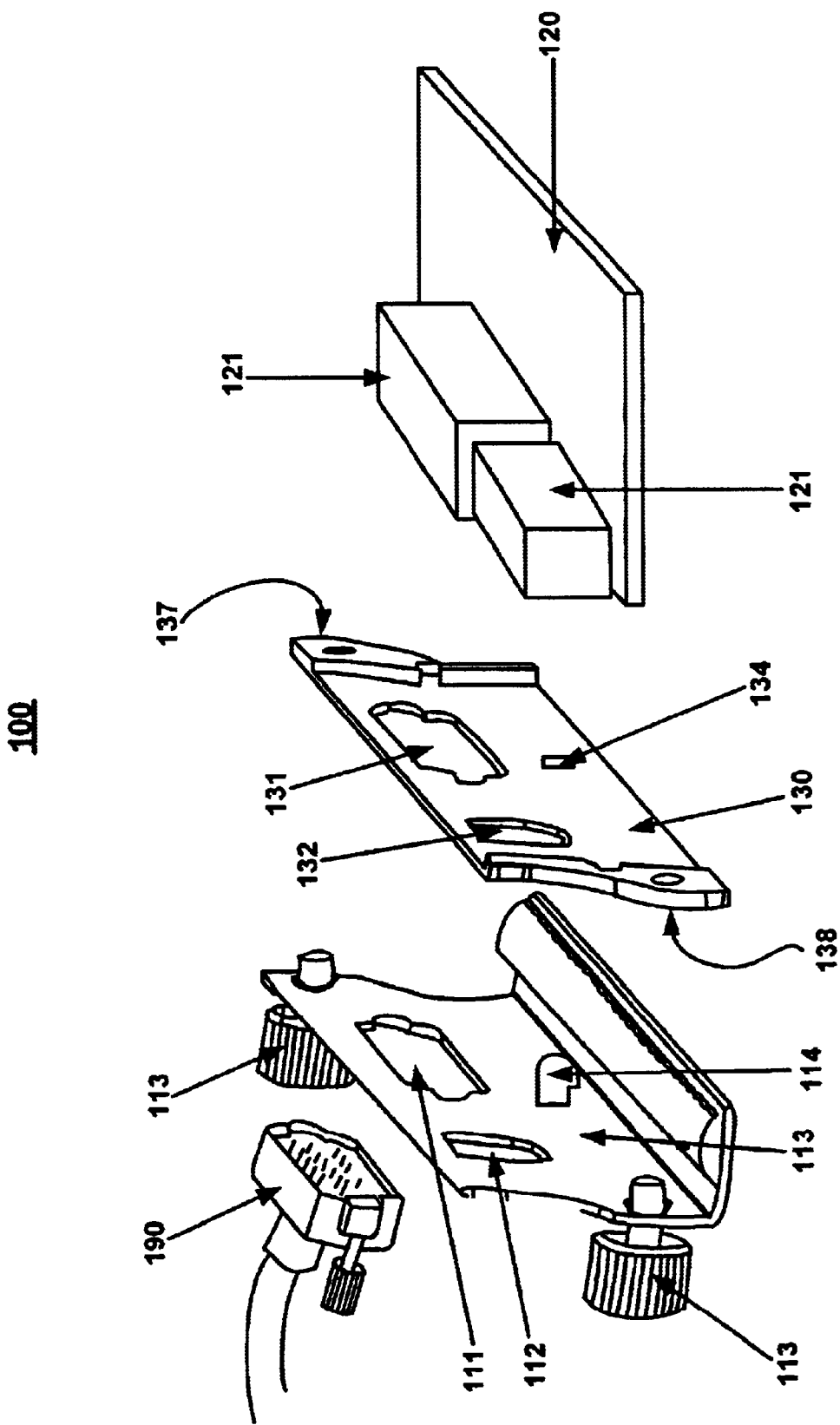
FIG. 1 is an exploded perspective view of a bulkhead, electromagnetic interference source, and electromagnetic interference containment apparatus.

FIG. 1 is an exploded perspective view of a bulkhead 110, an electromagnetic interference source 120, and electromagnetic interference containment apparatus 130 (herein referred to as EMI gasket 130) which are, for example, components of a computer system. In one embodiment of the present invention, electromagnetic interference source 120 is a PCA board and is herein referred to as PCA 120. While the present embodiment recites a PCA board as an electromagnetic source, the present invention is well suited for containing electromagnetic interference from other sources as well. It is appreciated that details of bulkhead 110, PCA 120, and EMI gasket 130 have been omitted form FIG. 1 for clarity.

Bulkhead 110 is comprised of openings 111 and 112 through which connectors 121, and 122 of PCA 120 extend when coupled with bulkhead 110 or through which plugs or connectors of peripheral devices may extend to couple with PCA 120. Bulkhead 110 further comprises thumbscrews 113 for rigidly coupling bulkhead 110 to a chassis (not shown). Additionally, a tab 114 extends from bulkhead 110. In one embodiment of the present invention, tab 114 is press fitted into opening 134 of EMI gasket 130 and thus couples bulkhead 110 with EMI gasket 130 without requiring additional attachment hardware. However, while the present embodiment recites using tab 114 to couple bulkhead 110 with EMI gasket 130, the present invention is well suited to utilize a variety of methods for coupling the two devices.

In accordance with one embodiment of the present invention, when PCA 120 is coupled with bulkhead 110, connectors 121 and 122 extend through openings 131 and 132 of EMI gasket 130 as well as openings 111 and 112 of bulkhead 110. A plug 190 is shown which can be coupled with connector 121 to allow PCA 120 to communicate with a peripheral component. EMI gasket 130 prevents electromagnetic emissions from PCA 120 from escaping the computer system via gaps between connectors (e.g., connectors 121 and 122) and openings in bulkhead 110 (e.g., openings 111 and 112).

Figure 2:
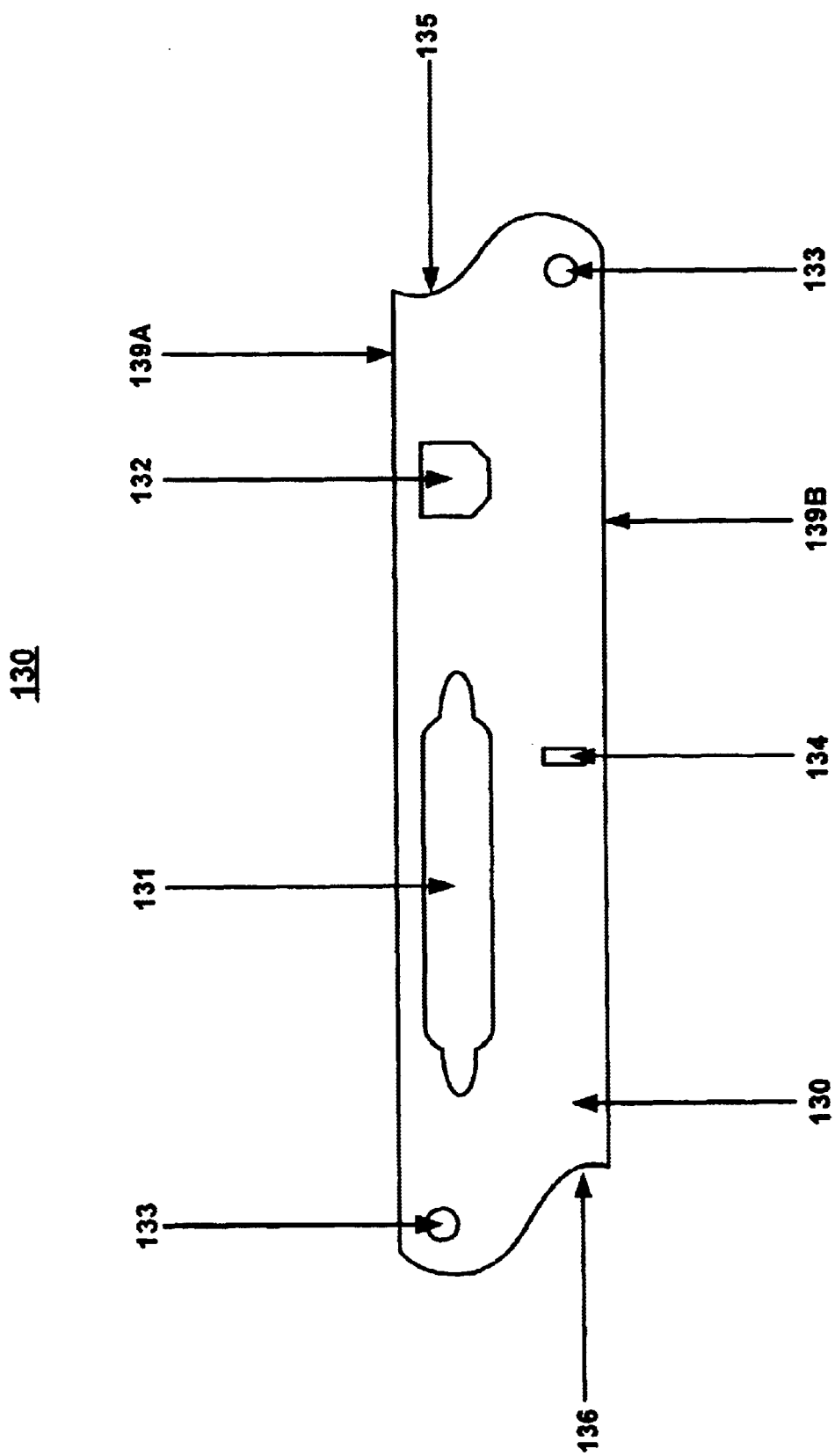
FIG. 2 is a front view of an exemplary electromagnetic interference containment apparatus in accordance with one embodiment of the present invention.

FIG. 2 is a front view of an exemplary EMI gasket in accordance with one embodiment of the present invention. Again, it is appreciated that details of EMI gasket 110 have been omitted from FIG. 2 for the sake of clarity. That is, the present invention is well suited to embodiments in which EMI gasket 130 has numerous other features, openings, and the like formed therein. FIG. 2 shows one configuration of openings 131 and 132 as well as openings 133 and 134. Thumbscrews 113 of bulkhead 110 extend through openings 133 when coupling bulkhead 110 with a chassis. Opening 134 is used in one embodiment of the present invention for coupling EMI gasket 130 with bulkhead 110.

As shown in FIG. 1, openings 131 and 132 allow access to connectors 121 and 122 through EMI gasket 130. For example, in FIG. 2 opening 131 is configured to allow access to a printer port connector (e.g., connector 121 of FIG. 1) through EMI gasket 130 while opening 132 is configured to allow access to an RJ-45 connector (e.g., connector 122 of FIG. 1) through EMI gasket 130. While the present embodiment recites these two connectors types specifically, the present invention is well suited to be configured to allow access to a variety of connectors and other devices attached to PCA 120 through EMI gasket 130.

In one embodiment of the present invention, EMI gasket 130 is comprised of a layer of compressible material with layers of conductive material coupled thereto for absorbing and conducting electromagnetic emissions. Specifically, in one embodiment, a first layer of conductive material is deposited on the back side 137 of EMI gasket 130, and a second layer of conductive material is disposed on the front side 138 of EMI gasket 130. In one embodiment of the present invention, the first layer of conductive material is electrically coupled with the second layer of conductive material. Electromagnetic emissions from PCA 120 are absorbed by the first layer of conductive material and conducted to the second layer of conductive material and ultimately to the bulkhead.

In one embodiment of the present invention, a portion of EMI gasket 130 is configured to comply with the contours of bulkhead 110. For example, in FIG. 2 side portions 135 and 136 are configured to comply with the contours of bulkhead 110. In one embodiment of the present invention, the first layer of conductive material and the second layer of conductive material are not electrically coupled in the portions of EMI gasket 130 which are configured to comply with the contours of bulkhead 110. That is, there is no wrap around of conductive material in side regions 135 and 136. This facilitates manufacture as it is more difficult to wrap complex shapes quickly and economically with conductive material. Referring to FIG. 2, the first and second layers of conductive material are, in one embodiment, electrically coupled along top edge 139A and/or bottom edge 139B. Thus, the present invention provides an economical electromagnetic interference containment apparatus which can conform to the contours of various components including those with complex contours.

In one embodiment of the present invention, openings extending through EMI gasket 130 are given dimensions slightly smaller than the devices which extend through the openings. For example, opening 131 has slightly smaller dimensions than connector 121 and opening 132 has dimensions slightly smaller than connector 132. Because EMI gasket 130 is comprised of a layer of compressible material, connectors 121 and 122 can be press fitted into openings 131 and 132 of EMI gasket 130. Openings 131 and 132 will then conform to the contours of connectors 121 and 122 and substantially eliminate air gaps around the connectors when PCA 120 and EMI gasket 130 are coupled with bulkhead 110. Additionally, the first layer of conductive material on the back side of EMI gasket 130 can be electrically coupled with the connectors and devices extending through EMI gasket 130. This ensures that electromagnetic emissions from PCA 120 do not escape through gaps between the connectors and bulkhead 110, and thus cause electromagnetic interference with electronic equipment in the vicinity. Alternatively, due to the smaller size of openings 131 and 132, connectors 121 and 122 can compress EMI gasket 130 against bulkhead 110 to close gaps around the connectors and prevent EMI emissions from escaping. As a result, the various embodiments of the present invention provide containment of electromagnetic emissions. Additionally, the present invention complies with industry standard electromagnetic interference emission standards.

Because the present invention is comprised of a layer of compressible material which conforms to the edges of connectors and other devices extending therethrough, the need for the small fingers used in sheet metal EMI shields is eliminated. Hence, the various embodiments of the present invention overcome problems associated with prior art sheet metal shielding such as fragility, the high cost of manufacture, and the possibility of injury during handling.

Figure 3A:
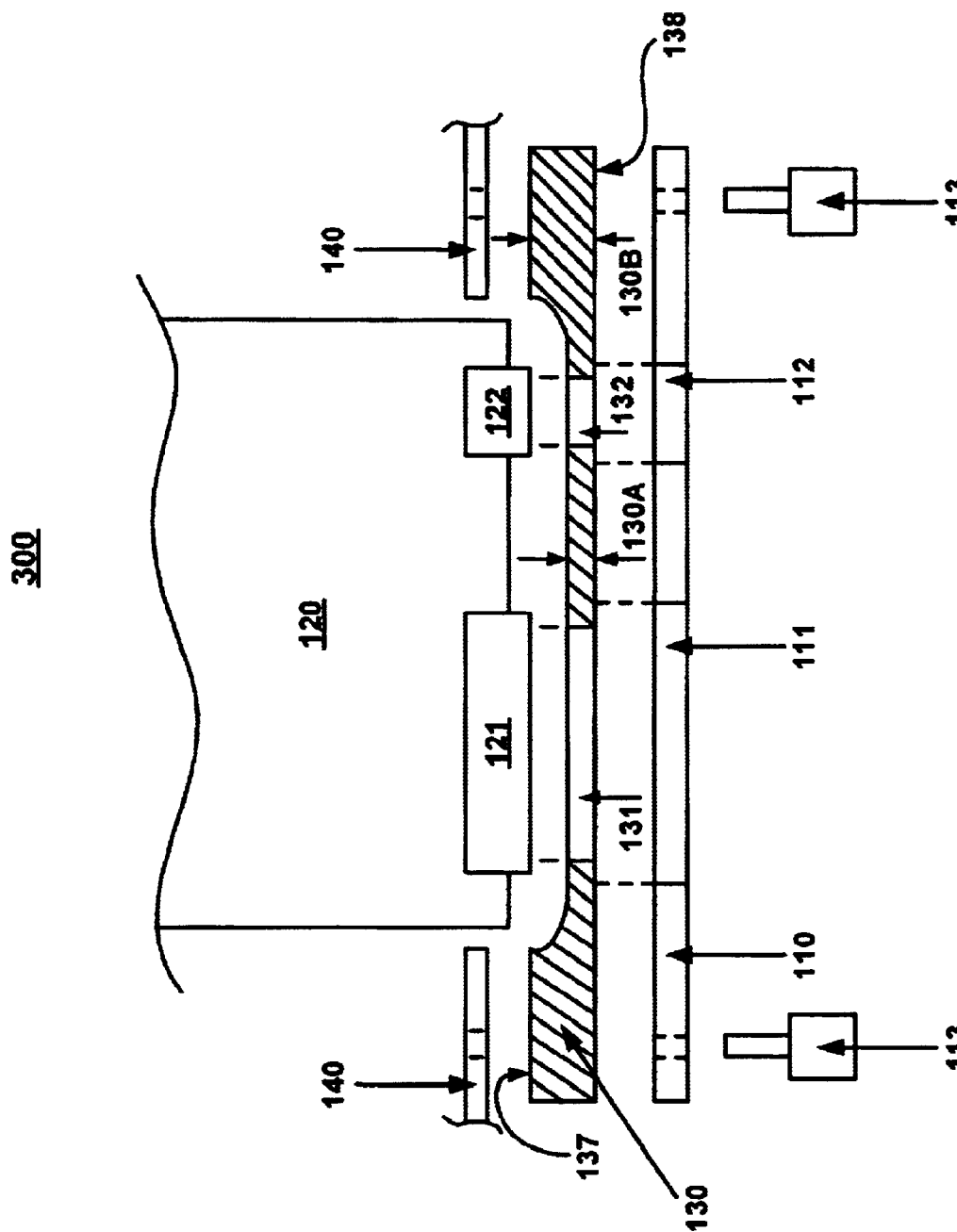
FIGS. 3A, 3B, and 3C are top views of an exemplary electromagnetic interference containment apparatus used in accordance with one embodiment of the present invention.
Figure 3B:
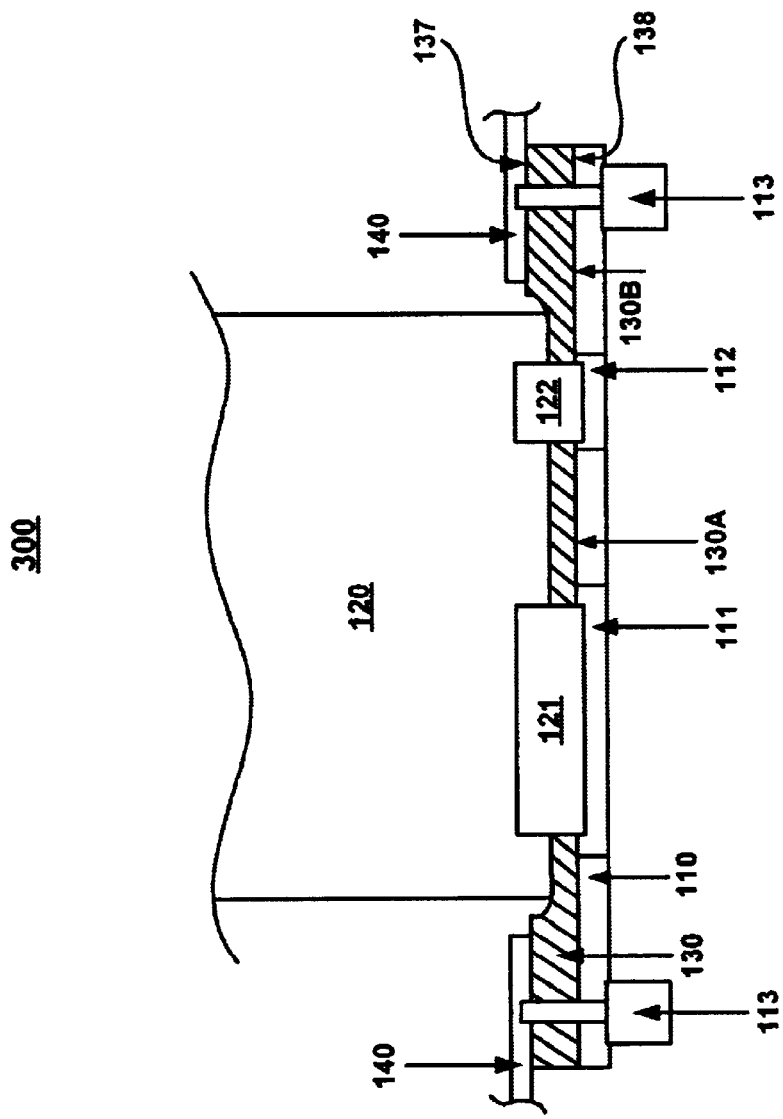
Figure 3C:
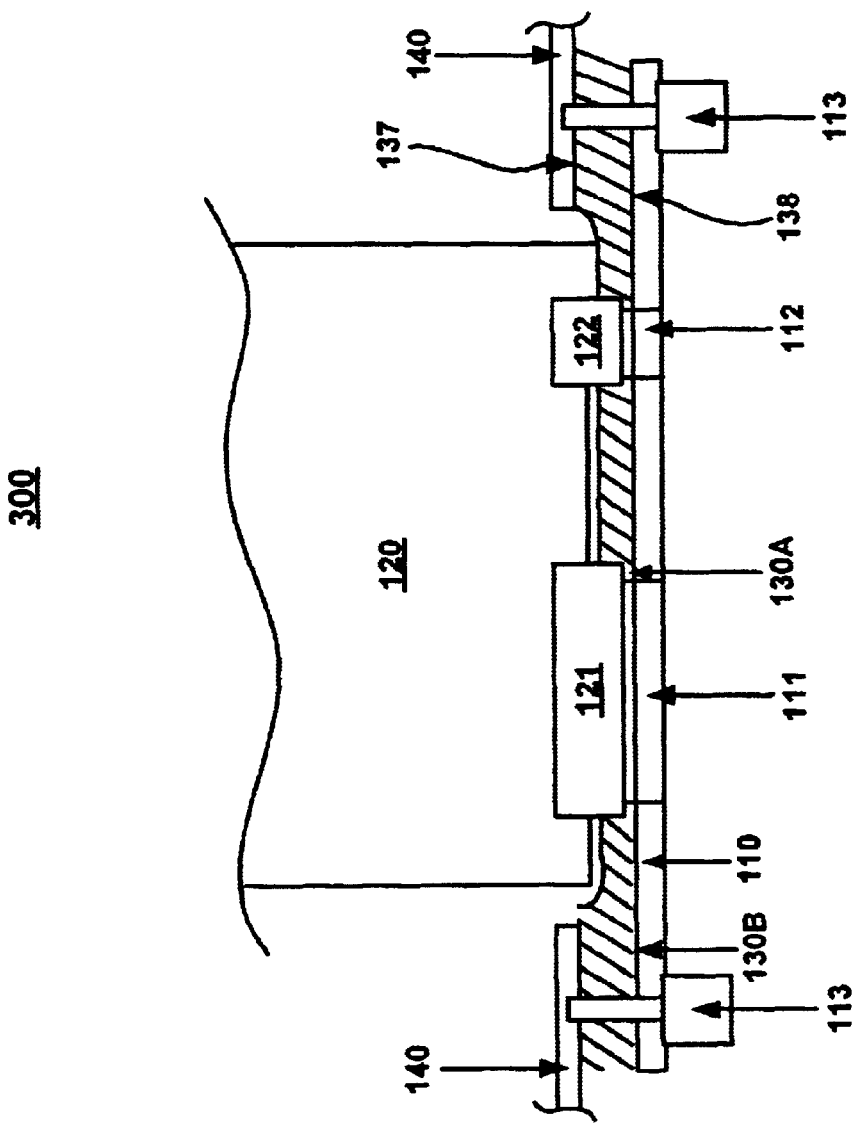

FIGS. 3A and 3B are top section views of an exemplary electromagnetic interference containment apparatus used in accordance with one embodiment of the present invention. FIG. 3A shows bulkhead 110, PCA 120, EMI gasket 130, and chassis 140 before being coupled, while FIGS. 3B and 3C show the same devices after being coupled.

EMI gasket 130 is a layer of compressible material with a first layer of conductive material disposed on back side 137, and a second layer of conductive material disposed on front side 138. In one embodiment, the compressible material for EMI gasket 130 is Poron® by Rogers Corporation of Rogers, Conn. However, while the present embodiment recites Poron®, the present invention is well suited to use a variety of compressible materials as well. In one embodiment, the conductive material on back side 137 and front side 138 is Chromerics® foil by Parker Hannifin Corporation of Woburn, Mass. However, the present invention may utilize a variety of conductive materials for this purpose.

The conductive material on back side 137 and front side 138 is electrically coupled. In one embodiment, this is accomplished by wrapping the layer of compressible material of EMI gasket 130 with a single piece of conductive material. In so doing, back side 137 and front side 138 are, for example, electrically coupled along top edge 139A and bottom edge 139B while side portions 135 and 136 are left unwrapped. However, the present invention is suited for electrically coupling front side 138 and back side 137 in other regions of EMI gasket 130 as well. According to embodiments of the present invention, sides 135 and 136 can be configured to conform to the contours of bulkhead 110. In one embodiment, sides 135 and 136 are not electrically coupled along these configured portions of EMI gasket 130. For example, front side 138 and back side 137 are electrically coupled along the top and bottom edges (139A and 139B respectively of FIG. 2), while sides 135 and 136 are unwrapped exposed Poron®. This facilitates manufacture as it is more difficult to wrap complex shapes quickly and economically with conductive material.

As shown in FIG. 3A, EMI gasket 130 has a first thickness 130A and a second thickness 130B. More specifically, EMI gasket 130 is thicker in the outer portions (e.g., thickness 130B) where it will be disposed between chassis 140 and bulkhead 110 than in the portion where EMI gasket 130 is disposed between PCA 120 and bulkhead 110 (e.g., thickness 130A). In one embodiment, this is accomplished by utilizing a double thickness (e.g., two layers) of compressible material in the region where bulkhead 110 couples with chassis 140, while using a single layer of compressible material in the other regions of EMI gasket 130. Thus, in various embodiments of the present invention, multiple layers of compressible material are used to create a first thickness and a second thickness for EMI gasket 130. This allows the thickness of EMI gasket 130 to be optimized for different separation tolerances which may be encountered. For example, a first thickness 130A of EMI gasket is configured for the separation tolerance between PCA 120 and bulkhead 110 or a separation tolerance between connectors 121/122 and bulkhead 110. A second thickness 130B of EMI gasket 130 is configured for the separation tolerance between bulkhead 110 and chassis 140.

Sheet metal EMI shielding is typically fabricated in one thickness to minimize tooling costs and ease manufacture. However, as mentioned above, separation tolerances between chassis 140 and bulkhead 110 are unrelated to the separation tolerances between bulkhead 110 and PCA 120 and can be 2 to 3 times as large. Therefore, a sheet metal EMI shield is not able to provide optimal separation tolerances between connctors 121/122 and bulkhead 110 or between bulkhead 110 and chassis 140. Often an amortized or average value is used as the single thickness for the sheet metal EMI shield. This results in less than optimal separation tolerances for any of the components. The present invention has a first thickness (130A) and a second thickness (130B) which facilitates accommodating both sets of separation tolerances with a single piece EMI gasket. This ensures a better electrical coupling between EMI gasket 130, PCA 120, bulkhead 110, and chassis 140. Furthermore, utilizing multiple layers of compressible material facilitates meeting varied minimum compression requirements between PCA 120 and bulkhead 110, connectors 121/122 and bulkhead 110, as well as between bulkhead 110 and chassis 140. In accordance with embodiments of the present invention, various materials can be used as the layer of compressible material in EMI gasket 130 in order to provide varying levels of compression between, for example, bulkhead 110 and chassis 140.

As shown in FIG. 3B, PCA 120, EMI gasket 130, bulkhead 110, and chassis 140 are coupled. As shown in FIG. 3B, EMI gasket 130 is now compressed between PCA 120 and bulkhead 110 and thickness 130A of FIG. 3A is now compressed to a thickness 130A' and thickness 130B of FIG. 3A is now compressed to a thickness 130B'. For example, in one embodiment of the present invention, thickness 130A' is 0.6 mm, while thickness 130B' is 1.2 mm. Thus, the present invention provides an electromagnetic containment device which can accommodate varying separation tolerances across the same device. The first layer of conductive material on back side 137 is now electrically coupled with PCA 120 as well as with connectors 121 and 122. Additionally, the second layer of conductive material on front side 138 is now electrically coupled with bulkhead 110. The electromagnetic emissions are then conducted to chassis 140 (e.g., via thumbscrews 113 or via conductive material on back side 137). Thus, the present invention provides an electromagnetic interference containment apparatus which prevents EMI emissions from leaking past bulkhead 110.

As shown in the embodiment of FIG. 3C, PCA 120, EMI gasket 130, bulkhead 110, and chassis 140 are now coupled. In the embodiment of FIG. 3B, the connectors extend through the openings in EMI gasket 130. The compressible material of EMI gasket 130 is compressed to conform to the contours of the connectors and thus prevent EMI leakage. In the embodiment of FIG. 3C, the connectors (e.g., connectors 121 and 122) compress EMI gasket 130 against bulkhead 110 to close air gaps around the connectors through which EMI can escape. Thus, thickness 130A of FIG. 3A is now compressed to a thickness 130A' which is configured for a first thickness between connectors 121/122 and bulkhead 110. Additionally, thickness 130B of FIG. 3A is now compressed to a thickness 130B' which is configured for a second thickness between bulkhead 110 and chassis 140. For example, in one embodiment of the present invention, thickness 130A' is 0.6 mm, while thickness 130B' is 1.2 mm. Thus, the present invention provides a single piece electromagnetic containment device which can accommodate varying separation tolerances across the same device. The first layer of conductive material on back side 137 is now electrically coupled with connectors 121 and 122. The second layer of conductive material on front side 138 is now electrically coupled with bulkhead 110. The electromagnetic emissions are then conducted to chassis 140 (e.g., via thumbscrews 113 or via conductive material on back side 137). Thus, the present invention provides an electromagnetic interference containment apparatus which prevents EMI emissions from leaking past bulkhead 110.

Figure 4:
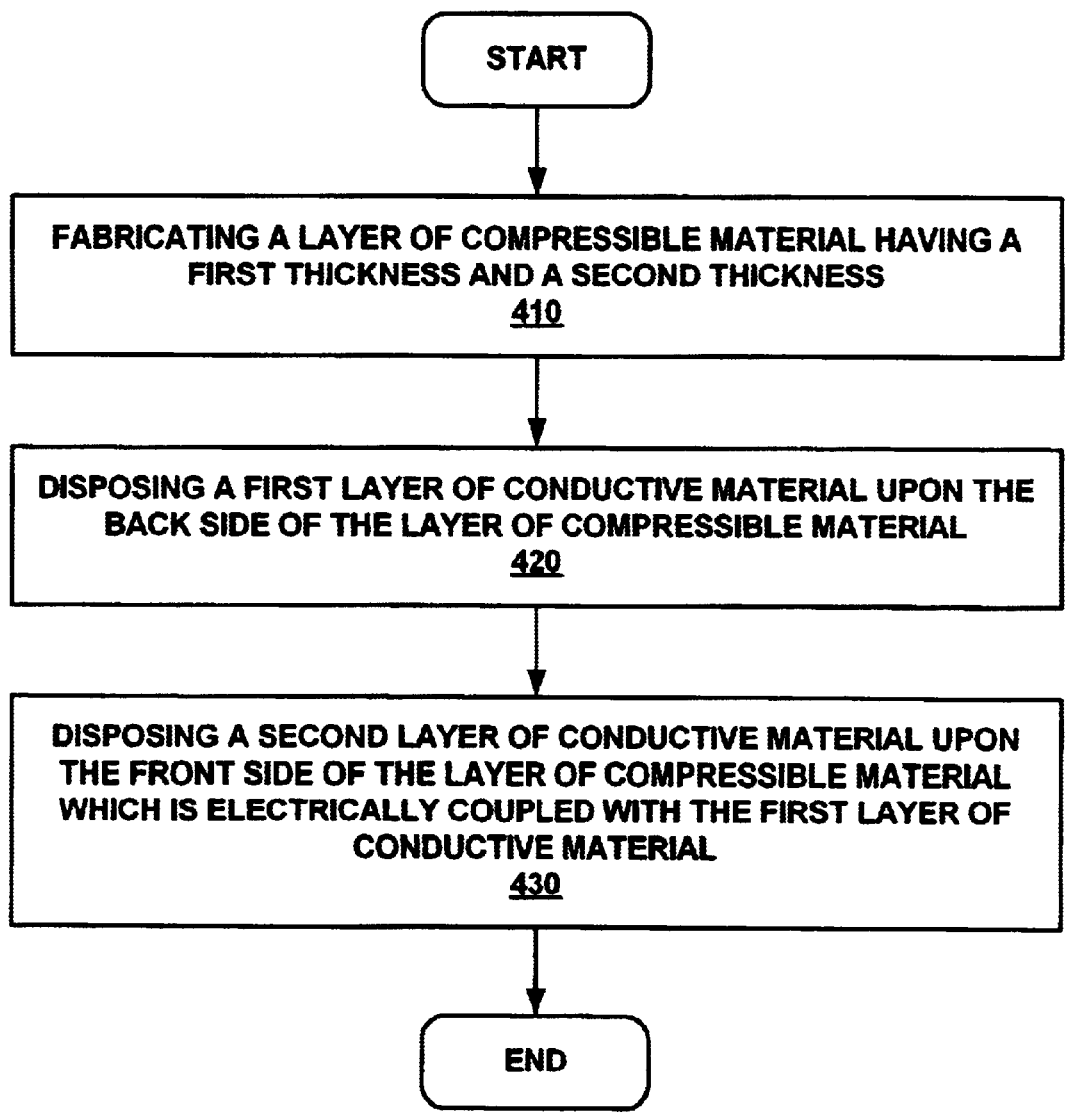
FIG. 4 is a flowchart of a method for fabricating an electromagnetic interference containment apparatus in accordance with embodiments of the present invention.

FIG. 4 is a flowchart of a method for fabricating an electromagnetic interference containment apparatus in accordance with embodiments of the present invention.

With reference to FIG. 3A and to step 410 of FIG. 4, a layer of compressible material is fabricated having a first thickness and a second thickness. The layer of compressible material (e.g., Poron®) is further adapted to be disposed between a bulkhead and a electromagnetic interference source. Referring to FIG. 3A, EMI gasket 130 is a layer of compressible material which is adapted to be disposed between PCA 120 and bulkhead 110. Using a compressible material allows EMI gasket 130 to comply with the contours of connectors (e.g., connectors 121 and 122) and bulkhead 110. This eliminates the necessity of using sheet metal fingers to seal the gap that would otherwise exist between connectors 121 and 122 and the corresponding openings in bulkhead 110. Furthermore, using a compressible material allows, in one embodiment of the present invention, coupling EMI gasket 130 with bulkhead 110 without requiring additional attachment hardware. For example, tab 114 of FIG. 1 can be press fitted into opening 134 to couple bulkhead 110 with EMI gasket 130.

In one embodiment, EMI gasket 130 is configured to comply with the contours of bulkhead 110. Furthermore, in one embodiment, EMI gasket 130 is comprised of multiple layers of compressible material to give it a first thickness and a second thickness. This facilitates adapting EMI gasket to accommodate various separation tolerances and minimum compression requirements between, for example, bulkhead 110 and connectors 121/122, and between bulkhead 110 and chassis 140. Specifically, the first thickness of EMI gasket 130 is configured for the separation tolerance between PCA 120 and bulkhead 110, or between connectors 121/122 and bulkhead 110, and the second thickness of EMI gasket 130 is configured for the separation tolerance between bulkhead 110 and chassis 140 of an electrically grounded device.

With reference to FIG. 3A and to step 420 of FIG. 4, a first layer of conductive material is disposed upon the back side of the layer of compressible material. Referring to FIG. 3A, the first layer of conductive material is deposited upon back side 137. In one embodiment of the present invention, the first layer of conductive material is Chromerics® foil. However, the present invention is well suited to utilize a variety of materials for the first layer of conductive material. The first layer of conductive material is for absorbing electromagnetic emissions from an electromagnetic source (e.g., PCA 120).

With reference to FIG. 3A, and to step 430 of FIG. 4, a second layer of conductive material is disposed upon the front side of the layer of compressible material and is electrically coupled with the first layer of conductive material. Referring to FIG. 3A, the second layer of conductive material is deposited upon front side 138 of EMI gasket 130. In one embodiment of the present invention, the second layer of conductive material is Chromerics® foil. However, the present invention is well suited to use a variety of materials for the second layer of conductive material.

The first and second layers of conductive material are electrically coupled so that electromagnetic emissions absorbed by the layer of conductive material on back side 137 can be conducted to bulkhead 110 via the layer of conductive material on front side 138, and then to chassis 140. Thus, electromagnetic emissions are contained and conducted a chassis of a computer system. In one embodiment of the present invention, the first and second layers of conductive material are deposited by wrapping a conductive foil around the layer of compressible material. In one embodiment, the first and second conductive layers are not electrically coupled in the regions of EMI gasket 130 which are configured to comply with the contours of bulkhead 110.

The preferred embodiment of the present invention, an electromagnetic interference containment apparatus, is thus described. While the present invention has been described in particular embodiments, it should be appreciated that the present invention should not be construed as limited by such embodiments, but rather construed according to the following claims.

What is claimed is:

1. An electromagnetic interference containment apparatus comprising:

a layer of compressible material adapted to be disposed between an electromagnetic interference source and a bulkhead coupled to said electromagnetic interference source and to be coupled with the bulkhead without requiring additional attachment hardware, said layer of compressible material having a first thickness and a second thickness and having at least a portion configured to comply with contours of said bulkhead;

a first layer of conductive material disposed on a back side of said layer of compressible material for electrically coupling to said electromagnetic interference source and for absorbing electromagnetic emissions from said electromagnetic interference source; and a second layer of conductive material disposed on a front side of said layer of compressible material and electrically coupled to said first layer of conductive material, said second layer of conductive material for electrically contacting said bulkhead and for conducting said electromagnetic emissions to said bulkhead and wherein said first layer of conductive material is not electrically coupled to said second layer of conductive material along said configured portion.

2. The electromagnetic interference containment apparatus of claim 1, wherein said first thickness of said electromagnetic interference containment apparatus is configured for a separation tolerance between said electromagnetic interference source and said bulkhead.

3. The electromagnetic interference containment apparatus of claim 1, wherein said second thickness of said electromagnetic interference containment apparatus is configured for a separation tolerance between said bulkhead and an electrically grounded device to which said bulkhead is coupled.

4. The electromagnetic interference containment apparatus of claim 1, wherein said electromagnetic interference source is a printed circuit assembly.

5. A compressible electromagnetic interference (EMI) gasket comprising:

a layer of compressible material adapted to be disposed between a printed circuit assembly and a bulkhead and having at least a portion configured to comply with contours of said bulkhead, said layer of compressible material having a first thickness configured for a separation tolerance between said printed circuit assembly and said bulkhead and a second thickness configured for a separation tolerance between said bulkhead and an electrically grounded device to which said bulkhead is coupled, and wherein said layer of compressible material is configured to be coupled with the bulkhead without requiring additional attachment hardware;

a first layer of conductive material disposed on a back side of said layer of compressible material for electrically coupling to said printed circuit assembly and for absorbing electromagnetic emissions from said printed circuit assembly; and a second layer of conductive material disposed on a front side of said layer of compressible material and wherein said first layer of conductive material is not electrically coupled to said second layer of conductive material along said portion configured to comply with contours of said bulkhead, said second layer of conductive material for electrically contacting said bulkhead and for conducting said electromagnetic emissions to said bulkhead.

6. A method for fabricating an electromagnetic containment apparatus comprising:

fabricating a layer of compressible material, said layer of compressible material having a first thickness and a second thickness and adapted to be disposed between an electromagnetic interference source and a bulkhead and having at least a portion configured to comply with contours of said bulkhead, said layer of compressible material further configured to be coupled with the bulkhead without utilizing additional attachment devices;

disposing a first layer of conductive material upon a back side of said layer of compressible material, said first layer of conductive material for electrically coupling to said electromagnetic interference source and for absorbing electromagnetic emissions from said electromagnetic interference source; and disposing a second layer of conductive material upon a front side of said layer of compressible material, and wherein said first layer of conductive material is not electrically coupled to said second layer of conductive material along said portion configured to comply with contours of said bulkhead, and for conducting said electromagnetic emissions to said bulkhead.

7. The method for fabricating an electromagnetic containment apparatus as recited in claim 6, wherein said fabricating of said layer of compressible material comprises creating said first thickness to comply with a separation tolerance between said electromagnetic interference source and said bulkhead.

8. The method for fabricating an electromagnetic containment apparatus as recited in claim 6, wherein said fabricating of said layer of compressible material comprises creating said second thickness to comply with a separation tolerance between said bulkhead and an electrically grounded device to which said bulkhead is coupled.

9. The method for fabricating an electromagnetic containment apparatus as recited in claim 6, wherein said fabricating comprises disposing said electromagnetic containment apparatus between a printed circuit assembly and said bulkhead.

* * * * *